US012703247B2

(12) United States Patent
Busby

(10) Patent No.: US 12,703,247 B2
(45) Date of Patent: Aug. 11, 2026

(54) METHOD AND APPARATUS FOR GROUND FAULT DETECTION IN AN ELECTRIC WORK VEHICLE

(71) Applicant: Caterpillar Inc., Peoria, IL (US)

(72) Inventor: Robert D. Busby, Whittlesey (GB)

(73) Assignee: Caterpillar Inc., Peoria, IL (US)

( * ) Notice: Subject to any disclaimer, the term of this patent is extended or adjusted under 35 U.S.C. 154(b) by 197 days.

(21) Appl. No.: 18/578,583

(22) PCT Filed: Jun. 7, 2022

(86) PCT No.: PCT/US2022/032438

§ 371 (c)(1),
(2) Date: Jan. 11, 2024

(87) PCT Pub. No.: WO2022/271439

PCT Pub. Date: Dec. 29, 2022

(65) Prior Publication Data

US 2024/0198802 A1 Jun. 20, 2024

(30) Foreign Application Priority Data

Jun. 25, 2021 (GB) ..................................... 2109200

(51) Int. Cl.
*B60L 3/00* (2019.01)
*B60L 3/04* (2006.01)
(Continued)

(52) U.S. Cl.
CPC ........... *B60L 3/0046* (2013.01); *B60L 3/0069* (2013.01); *B60L 3/04* (2013.01); *B60L 58/21* (2019.02);
(Continued)

(58) Field of Classification Search
CPC ........ B60L 3/0046; B60L 3/0069; B60L 3/04; B60L 58/16; B60L 58/21; B60L 2200/40;
(Continued)

(56) References Cited

U.S. PATENT DOCUMENTS 8,618,809 B2 12/2013 Schumacher
9,496,730 B2 11/2016 Gallegos et al.
(Continued)

FOREIGN PATENT DOCUMENTS

CN 102044718 A 5/2011
CN 104716720 A 6/2015
(Continued)

OTHER PUBLICATIONS

Machine translation of Mueller et al. German Patent Document DE 102011011799 A1 Aug. 2012 (Year: 2012).*
(Continued)

*Primary Examiner* — Kevin J Comber

(57) ABSTRACT

A method of performing a ground fault test on a plurality of battery packs of an aggregated battery of an electric work vehicle. A circuit is configured to connect the aggregated battery to an isolation monitor. A plurality of contactors are configured to facilitate connection to the circuit and disconnection from the circuit of each of the plurality of battery packs. If the isolation monitor detects existence of a ground fault, the user of the electric work vehicle is notified of the existence of the ground fault. The plurality of contactors are opened. The closure of the plurality of contactors is sequenced to include each of the plurality of battery packs in the circuit with the isolation monitor in turn. The isolation monitor is used to determine whether the battery pack that is included in the circuit is a faulty battery pack. The faulty battery pack is disconnected.

20 Claims, 4 Drawing Sheets

(51) Int. Cl.
*B60L 58/21* (2019.01)
*G01R 31/52* (2020.01)

(52) U.S. Cl.
CPC .......... *G01R 31/52* (2020.01); *B60L 2200/40* (2013.01); *B60L 2250/00* (2013.01)

(58) Field of Classification Search
CPC ............. B60L 2250/00; B60L 2250/10; G01R 31/006; G01R 31/396; G01R 31/52; H10M 10/4207; H10M 10/425; H10M 10/4285; H10M 10/482; H10M 50/512; H10M 2010/4271
USPC ............................................................ 361/42
See application file for complete search history.

(56) References Cited

U.S. PATENT DOCUMENTS

| | | | | |
|---|---|---|---|---|
| 9,599,651 | B2 | 3/2017 | Weiss | |
| 10,882,403 | B2 | 1/2021 | Loftus | |
| 10,928,461 | B1 | 2/2021 | Stafl | |
| 2015/0219706 | A1* | 8/2015 | Loftus | B60L 58/20 324/503 |
| 2021/0055356 | A1* | 2/2021 | Stafl | G01R 31/3842 |

FOREIGN PATENT DOCUMENTS

| | | | | | |
|---|---|---|---|---|---|
| CN | 106740191 | A | | 5/2017 | |
| DE | 102011011799 | A1 | * | 8/2012 | B60L 3/04 |
| JP | 2013094032 | A | * | 5/2013 | B60L 3/0069 |
| WO | 2012030455 | A2 | | 3/2012 | |
| WO | WO-2020104508 | A1 | * | 5/2020 | B60L 58/18 |

OTHER PUBLICATIONS

Machine translation of Kudo et al. Japanese Patent Document JP 2013-94032 A May 2013 (Year: 2013).*
International search report related to Application No. PCT/US2022/032438; reported on Aug. 26, 2022.
Great Britain search report related to Application No. 2109200.2; reported on Mar. 28, 2022.

* cited by examiner 510
401
402
403
404
405
406
407
408
409
410
411
412
520
530
540
550

METHOD AND APPARATUS FOR GROUND FAULT DETECTION IN AN ELECTRIC WORK VEHICLE

CROSS-REFERENCE TO RELATED APPLICATION

This Application is a 35 USC §371 US National Stage filing of International Application No. PCT/US2022/032438 filed on Jun. 7, 2022 which claims priority under the Paris Convention to Great Britain Patent Application No. 2109200.2 filed on Jun. 25, 2021.

FIELD OF THE DISCLOSURE

The disclosure relates to the field of ground fault detection in electric work vehicles.

BACKGROUND

Electric work vehicles rely on rechargeable batteries, which may be susceptible to deterioration over time and may develop ground faults. For example, a cable rubbing against a casing may cause insulation to wear over time resulting in a conducting line coming into contact with the casing. Such a ground fault may be detected by using an isolation monitor to measure resistances. An electric work vehicle may comprise an aggregated battery comprising a plurality of battery packs. A ground fault may affect only one of the battery packs.

It is known to install an isolation monitor at machine level to detect whether a ground fault exists. Although a ground fault may be detected in relation to the aggregated battery it may be helpful to be able to identify which of the individual battery packs has the ground fault so that the individual battery pack in question may be replaced. Typically, identification of which battery pack has a ground fault is achieved by installing individual isolation monitors in each battery pack, in addition to the machine level isolation monitor, which can be expensive and inefficient. If more than one of those isolation monitors are online at once then interference occurs, so they are conventionally taken offline until a fault is detected at machine level and then turned on one by one in sequence until the fault is isolated. In practice, a ground fault may trigger an alarm or notification at machine level, for example at key on, after which a user will need to sweep through the isolation monitors one by one in order to detect which of the battery packs has the fault. The battery pack with the fault may then be taken offline or replaced.

SUMMARY OF THE DISCLOSURE

Against this background there is provided a method of performing a ground fault test on an aggregated battery of an electric work vehicle, the aggregated battery comprising a plurality of battery packs. The electric work vehicle comprises an isolation monitor and a circuit configured to connect the aggregated battery to the isolation monitor, wherein the circuit comprises a plurality of contactors configured to facilitate connection to the circuit and disconnection from the circuit of each of the plurality of battery packs. The method comprises, in an event that the isolation monitor detects existence of a ground fault, performing the following steps in order. A step (a) of notifying a user of the electric work vehicle of the existence of the ground fault. A step (b) of opening the plurality of contactors. A step (c) of sequencing closure of the plurality of contactors to include each of the plurality of battery packs in the circuit with the isolation monitor in turn, and using the isolation monitor to determine whether the battery pack that is included in the circuit with the isolation monitor comprises a faulty battery pack, wherein the faulty battery pack comprises a ground fault. A step (d) of disconnecting the faulty battery pack or battery packs.

There is also provided a ground fault location apparatus for an electric work vehicle, wherein the electric work vehicle comprises an aggregated battery comprising a plurality of battery packs: a battery management system: an isolation monitor; and a circuit configured to connect the aggregated battery to the isolation monitor, wherein the circuit comprises a plurality of contactors configured to facilitate connection to the circuit and disconnection from the circuit of each of the plurality of battery packs. In an event that the isolation monitor detects existence of a ground fault, the ground fault location apparatus is configured to notify a user of the electric work vehicle of the detection of existence of a ground fault. The ground fault location apparatus is further configured to use the battery management system to open the plurality of contactors. The ground fault location apparatus is further configured to use the battery management system to sequence closure of the plurality of contactors to include each of the plurality of battery packs in the circuit with the isolation monitor in turn, and use the isolation monitor to determine whether the battery pack that is included in the circuit with the isolation monitor comprises a faulty battery pack, wherein the faulty battery pack comprises a ground fault. The ground fault location apparatus is further configured to disconnect the faulty battery pack.

In this way, the location of a ground fault among a plurality of battery packs may be determined by a single isolation monitor, and the faulty battery pack may be disconnected until it is possible to replace or repair it.

BRIEF DESCRIPTION OF THE DRAWINGS

A specific embodiment of the disclosure will now be described, by way of example only, with reference to the accompanying drawings in which.

DETAILED DESCRIPTION

According to an embodiment of this disclosure, there is provided a method of ground fault location for an electric work vehicle. The electric work vehicle comprises an aggregated battery comprising a plurality of battery packs, a ground fault detection module and a circuit configured to connect the plurality of battery packs to the ground fault detection module. The ground fault detection module comprises an isolation monitor. The ground fault detection module shall be referred to as an isolation monitor throughout the specification, but is not limited to comprising an isolation monitor. The circuit comprises a plurality of contactors configured to disconnect each of the plurality of battery packs from the circuit. The plurality of contactors may comprise one or more contactors for each of the plurality of battery packs. The plurality of battery packs may comprise the plurality of contactors, or the plurality of contactors may be part of the circuit external to the plurality of battery packs. The method comprises using the isolation monitor to detect whether a ground fault exists. In the event that a ground fault exists, a user of the electric work vehicle is notified. The electric work vehicle is turned off, and the plurality of connectors are opened to disconnect all battery packs from the circuit. It is determined which of the battery packs is faulty by sequencing closure of the plurality of contactors to include each of the plurality of battery packs in the circuit with the isolation monitor. The faulty battery pack is disconnected.

There is also provided a ground fault location apparatus for an electric work vehicle, configured to locate a ground fault. The electric work vehicle comprises a plurality of battery packs, a battery management system and an isolation monitor. The electric work vehicle further comprises a circuit configured to connect the plurality of battery packs to the isolation monitor, wherein the circuit comprises a plurality of contactors configured to disconnect each of the plurality of battery packs from the circuit. The ground fault location apparatus is configured to locate a ground fault by using the isolation monitor to detect existence of a ground fault. In the event that a ground fault is detected, the apparatus then notifies a user of the electric work vehicle of the detection of existence of a ground fault and turns off the electric work vehicle. The apparatus uses the battery management system to open the plurality of contactors and to locate the ground fault in a faulty battery pack by sequencing closure of the plurality of contactors to include each of the plurality of battery packs in a circuit with the isolation monitor. The apparatus disconnects the faulty battery pack.

In this way, the location of a ground fault among a plurality of battery packs may be determined by a single isolation monitor, and the faulty battery pack may be disconnected until it is possible to replace it.

Figure 1:
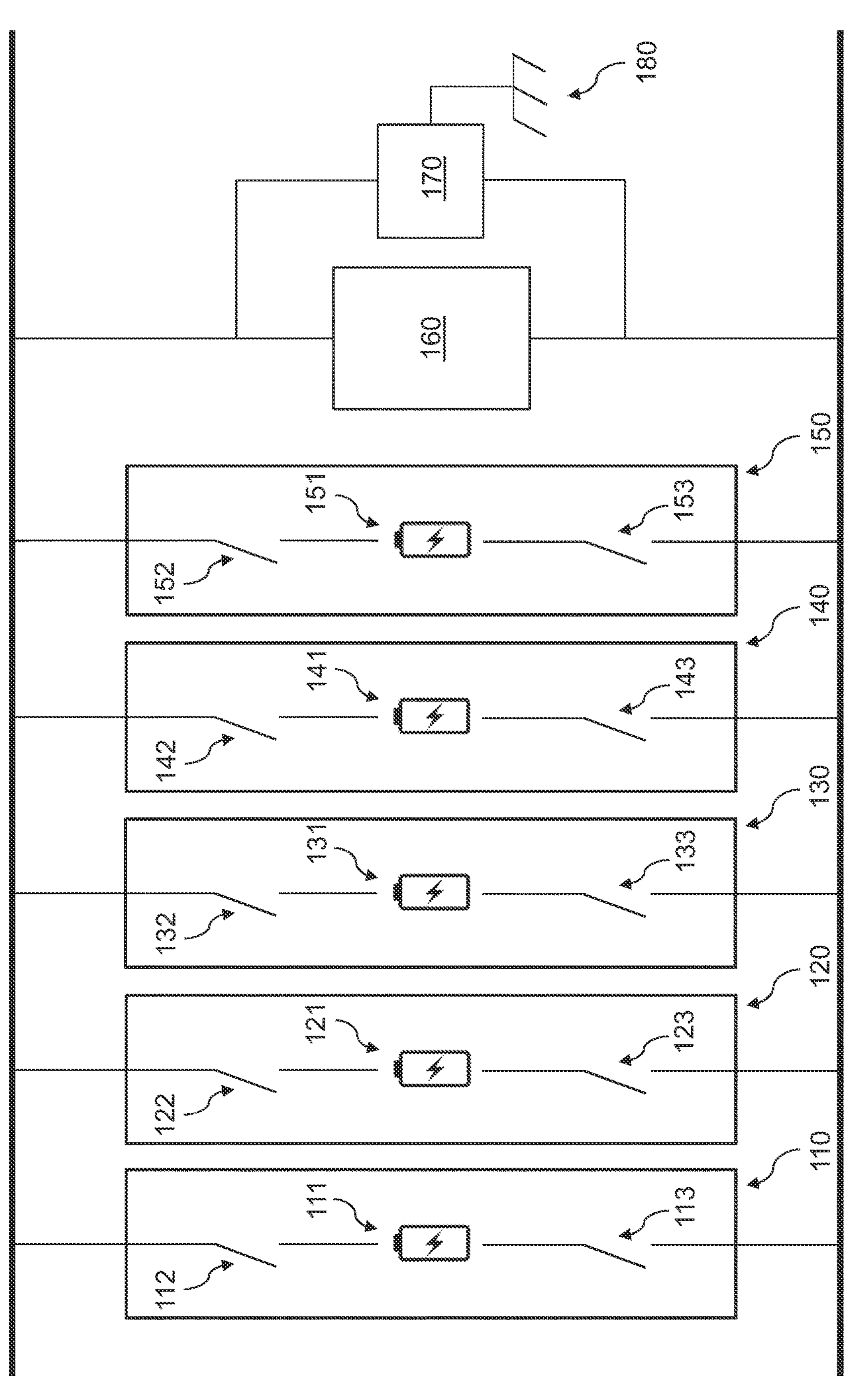
FIG. 1 shows a schematic diagram of a plurality of battery packs connected to an isolation monitor in accordance with an embodiment of the present disclosure.

With reference to FIG. 1, a schematic diagram of the circuit connecting the plurality of battery packs to the isolation monitor is shown according to an embodiment of the disclosure. The electric work vehicle comprises at least one battery pack. In the exemplary embodiment illustrated in FIG. 1, five (5) battery packs 110, 120, 130, 140 and 150 are shown. It will be understood that the electric work vehicle may comprise fewer or more battery packs than are illustrated in FIG. 1. Each battery pack 110, 120, 130, 140 and 150 comprises a power storage module 111, 121, 131, 141 and 151, a first contactor 112, 122, 132, 142 and 152, and a second contactor 113, 123, 133, 143 and 153. FIG. 1 shows the first contactors 112, 122, 132, 142 and 152, and the second contactors 113, 123, 133, 143 and 153 in the open position such that the battery packs 110, 120, 130, 140 and 150 are disconnected from the circuit. It will be understood that each of the contactors may be open or closed. In normal use of the electric work vehicle all contactors would be expected to be closed such that all the battery packs are included in the circuit. In a method according to an embodiment of the disclosure (described later), at a given time the contactors may be all closed, all open, or a mixture of open and closed. In other embodiments, each battery pack may comprise one or more contactors. In other embodiments, each battery pack may comprise no contactors and each battery pack may be connected to a part of the circuit comprising one or more contactors such that each battery pack may be individually connected to and disconnected from the circuit.

The power storage modules 111, 121, 131, 141 and 151 may comprise rechargeable power storage modules. The plurality of battery packs 110, 120, 130, 140 and 150 may be connected in parallel to each other. The electric work vehicle further comprises an isolation monitor 170 that is configured to be connected in a circuit with the plurality of battery packs 110, 120, 130, 140 and 150. The electric work vehicle may further comprise power electronics 160 connected to the isolation monitor 170 and to the battery packs 110, 120, 130, 140 and 150. The isolation monitor 170 is mounted on the electric work vehicle (not shown) and controlled by a battery management system (BMS). The isolation monitor may be connected to a chassis ground 180.

The electric work vehicle further comprises a battery management system and a controller area network, and wherein the isolation monitor communicates with the battery management system over the controller area network.

In an embodiment, the plurality of contactors may comprise relay switches. In another embodiment, the plurality of contactors may be on a negative side of the circuit.

A battery pack may comprise a single power storage module, or a plurality of power storage modules. A battery pack may be referred to elsewhere as a battery or a battery module.

Figure 2:
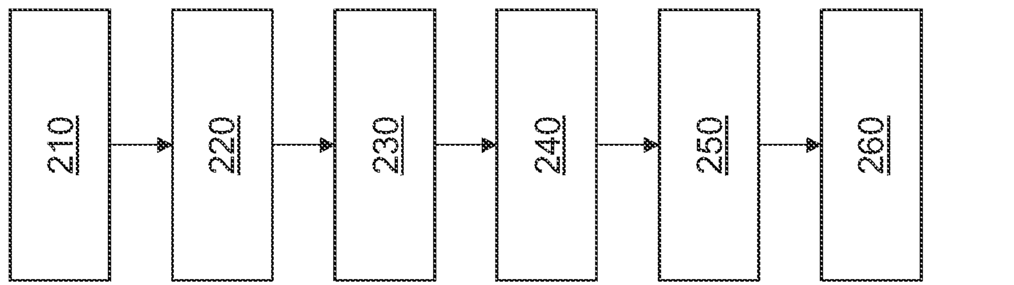
FIG. 2 shows a flowchart illustrating a method of ground fault location in accordance with an embodiment of the present disclosure.

A method of ground fault location according to an embodiment of the present disclosure is illustrated by the flow diagram of FIG. 2. The method may be for an electric work vehicle comprising a plurality of battery packs (110, 120, 130, 140 and 150 as illustrated in FIG. 1, although it will be understood that there may be fewer or more battery packs), an isolation monitor 170 and a circuit configured to connect the plurality of battery packs 110, 120, 130, 140 and 150 to the isolation monitor 170, wherein the circuit comprises a plurality of contactors (112, 122, 132, 142,152, 113, 123, 133, 143 and 153 in FIG. 1) configured to disconnect each of the plurality of battery packs 110, 120, 130, 140 and 150 from the circuit. The method may comprise a step 210 of using the isolation monitor 170 to detect whether a ground fault exists. In the event that a ground fault exists, at step 220 a user of the electric work vehicle may be notified that a ground fault exists. At step 230, the aggregated battery may be isolated from the electric work vehicle. At least one contactor per battery pack may be opened at step 240 to disconnect the plurality of battery packs from the circuit. For example, with reference to FIG. 1, contactors 113, 123, 133, 143 and 153 may be opened. At step 250, a faulty battery pack that comprises the ground fault is located among the plurality of battery packs by testing each battery pack in turn using the isolation monitor 170. Step 250 may comprise sequencing closure of the plurality of contactors (for example 113, 123, 133, 143 and 153) to include each of the plurality of battery packs (for example 110, 120, 130, 140 and 150) in the circuit with the isolation monitor 170 in turn. The sequencing may involve closure of one of the plurality of contactors (for example 113, 123, 133, 143 and 153) at any one time. The faulty battery pack is disconnected at step 260. The faulty battery pack may remain disconnected until it is repaired or replaced, even in the event that the electric work vehicle is turned on.

Once it has been determined that there is a ground fault, the method may further comprise a step of determining whether the ground fault is among the plurality of battery packs or elsewhere on the electric work vehicle. This step may occur between steps 210 and 250. In the event the ground fault is not among the plurality of battery packs the method may notify the user that there is a ground fault elsewhere on the electric work vehicle, and the method may be terminated. In the event that the ground fault is among the plurality of battery packs, the method may proceed to determining which of the plurality of battery packs is faulty. The step of determining whether the ground fault is among the plurality of battery packs or elsewhere on the electric work vehicle may comprise closing all of the plurality of contactors to include all of the plurality of battery packs in the circuit with the isolation monitor at once. In the event that the isolation monitor does not detect a ground fault when all of the plurality of battery packs are included in the circuit with the isolation monitor, the previously detected ground fault is concluded to be elsewhere on the electric work vehicle. In the event that the isolation monitor does detect a ground fault when all of the plurality of battery packs are included in the circuit with the isolation monitor, the method proceeds to determine which of the plurality of battery packs is faulty. This step may otherwise comprise opening all of the plurality of contactors to disconnect all of the plurality of battery packs from the isolation monitor. In the event that the isolation monitor does detect a ground fault when none of the plurality of battery packs are included in the circuit with the isolation monitor, the previously detected ground fault is concluded to be elsewhere on the electric work vehicle. In the event that the isolation monitor does not detect a ground fault when none of the plurality of battery packs are included in the circuit with the isolation monitor, the method proceeds to determine which of the plurality of battery packs is faulty.

Figure 3:
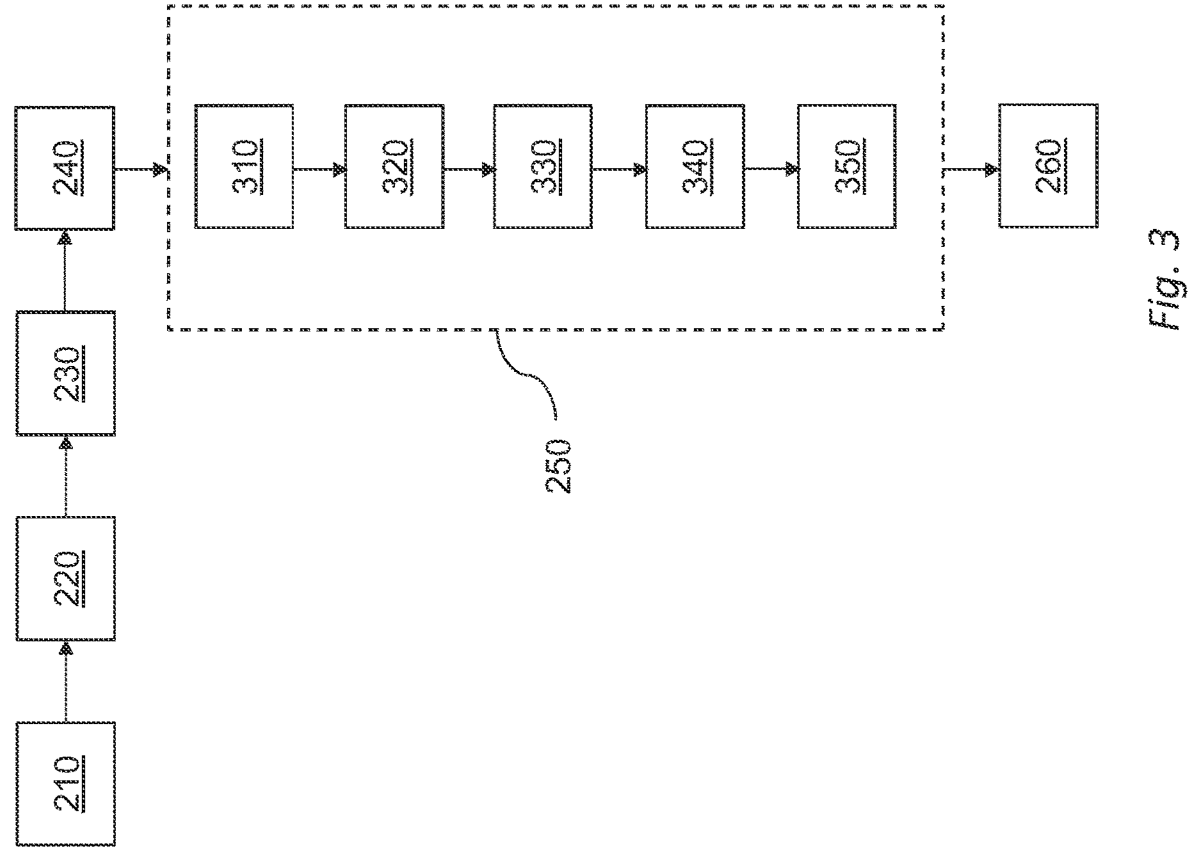
FIG. 3 shows a flowchart illustrating a method of ground fault location in accordance with an embodiment of the present disclosure.

In an embodiment, the method may further comprise a step of notifying the user which battery pack is faulty and/or that the faulty battery pack requires repairing or replacing Step 250 of locating the faulty battery pack may comprise closing a contactor in each of the plurality of battery packs in turn. When an individual battery pack is included in the circuit with the isolation monitor 170, the isolation monitor will determine whether there is a ground fault in that battery pack. With reference to FIG. 3, a method according to an embodiment of the disclosure is illustrated for the apparatus illustrated in FIG. 1 comprising 5 battery packs 110, 120, 130, 140 and 150. Where steps are the same as those in FIG. 2, they share reference numerals. At step 240 the contactors 113, 123, 133, 143 and 153 may be opened. Contactors 112, 122, 132, 142 and 152 may remain closed. Step 250 may then comprise closing each of the open contactors 113, 123, 133, 143 and 153 one by one, so that the plurality of battery packs 110, 120, 130, 140 and 150 are included in the circuit with the isolation monitor 170 one by one. Step 310 may comprise closing contactor 112, using the isolation monitor to detect whether there is a ground fault in battery pack 110, and then opening contactor 112. Step 320 may comprise closing contactor 122, using the isolation monitor to detect whether there is a ground fault in battery pack 120, and then opening contactor 122. Step 330 may comprise closing contactor 132, using the isolation monitor to detect whether there is a ground fault in battery pack 130, and then opening contactor 132. Step 340 may comprise closing contactor 142, using the isolation monitor to detect whether there is a ground fault in battery pack 140, and then opening contactor 142. Step 350 may comprise closing contactor 152, using the isolation monitor to detect whether there is a ground fault in battery pack 150, and then opening contactor 152.

In the event that a fault is found in a given battery pack, the method may continue to check the remaining battery packs. In another embodiment, the method may close all contactors to include all of the plurality of battery packs in the circuit with the isolation monitor 170 to check that there is no remaining ground fault. In the event that there is no remaining ground fault, the method ends. In the event that a ground fault remains, the method resumes sequencing the remaining battery packs.

In another embodiment, step 250 may comprises including batches of the plurality of battery packs in a circuit with the isolation monitor 170, in order to narrow down the location of the ground fault. For example, in the event that the electric work vehicle comprises x battery packs, step 250 may comprise including a first batch of x/2 battery packs in the circuit with the isolation monitor 170 and then including the second batch of x/2 battery packs in the circuit with the isolation monitor 170. It may then be determined which batch of x/2 battery packs comprises the faulty battery pack. The batch of x/2 battery packs that comprises the faulty battery pack may be included one by one in the circuit with the isolation monitor 170 or split into further batches of x/4 battery packs. In this way, the isolation monitor may need to make fewer tests than when including each battery pack in the circuit with the isolation monitor one by one. It will be understood that this method may be carried out with different numbers of batches of battery packs containing different proportions of the total number of battery packs. There may be fewer or more iterations of splitting into batches. The smallest batch size may be larger than one. There may be overlap between batches, such that a particular battery pack is included in more than one batch in a given iteration.

Figure 4:
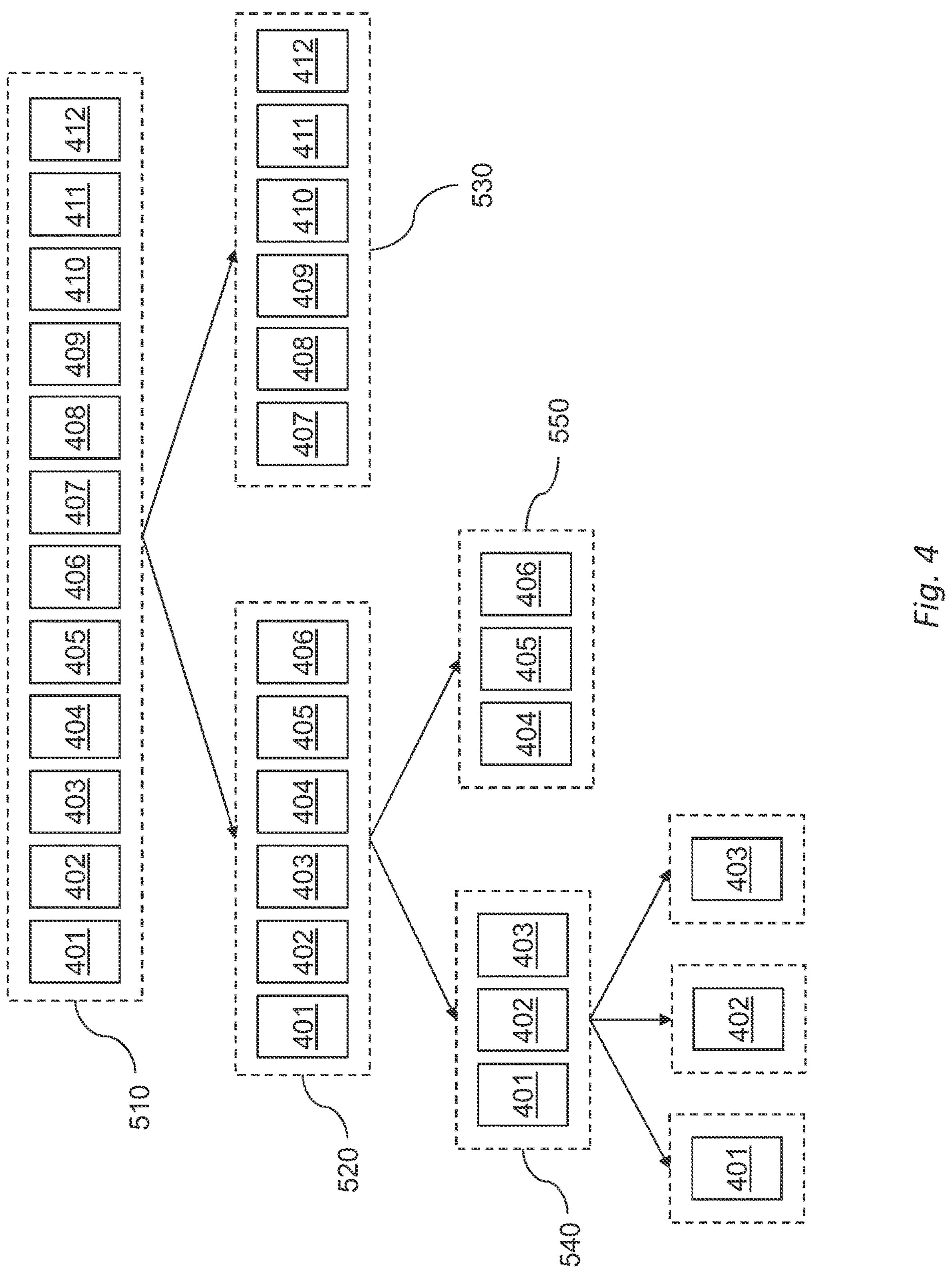
FIG. 4 shows a schematic diagram of ground fault location in batches of battery packs in accordance with an embodiment of the present disclosure.

An example of testing battery packs in batches is illustrated in FIG. 4. The aggregated battery 510 comprises twelve battery packs 401 to 412. The aggregated battery 510 may be split into a first batch 520 comprising six battery packs 401 to 406, and a second batch 530 comprising six battery packs 407 to 412. To test the first batch 520, the first batch 520 may be included in the circuit with the isolation monitor 170 by closing all contactors of the first batch 520 and opening a contactor in each battery pack of the second batch 530. To test the second batch 530, the second batch 530 may be included in the circuit with the isolation monitor 170 by closing all contactors of the second batch 530 and opening a contactor in each battery pack of the first batch 520. Once it has been determined which batch contains the faulty battery pack, that batch may be split into two sub-batches each containing 3 battery packs. In the exemplary scenario illustrated in FIG. 4, the first batch 520 is found to be faulty and is split into a first sub-batch 540 comprising battery packs 401 to 403 and a second sub-batch 550 comprising battery packs 404 to 406. To test the first sub-batch 540, the first sub-batch 540 may be included in the circuit with the isolation monitor 170 by closing all contactors of the first sub-batch 540 and opening a contactor in each battery pack of the second sub-batch 550. To test the second sub-batch 550, the second sub-batch 550 may be included in the circuit with the isolation monitor 170 by closing all contactors of the second sub-batch 550 and opening a contactor in each battery pack of the first sub-batch 540. Once it has been determined which sub-batch contains the faulty battery pack, each battery pack within the sub-batch may be tested one by one by including it in the circuit with isolation monitor 170. In the exemplary scenario illustrated in FIG. 4 the faulty battery pack is found to be in the first sub-batch 540, and battery packs 401, 402 and 403 are included one by one in the circuit with the isolation monitor. In this way, the isolation monitor makes seven tests (rather than the twelve tests required if each of the twelve battery packs is tested in turn). The total battery 510 may alternatively be split into three batches each containing four battery packs. Each batch of four battery packs may be split into two sub-batches of two battery packs.

The isolation monitor 170 used to detect a ground fault in a battery pack may be the machine level isolation monitor that detects whether there is a ground fault anywhere the electric work vehicle. The isolation monitor 170 may be separate to the machine level isolation monitor.

The invention claimed is:

1. A method of performing a ground fault test on an aggregated battery of an electric work vehicle, the aggregated battery comprising a plurality of battery packs, wherein the electric work vehicle comprises an isolation monitor and a circuit configured to connect the aggregated battery to the isolation monitor, wherein the circuit comprises a plurality of contactors configured to facilitate connection to the circuit and disconnection from the circuit of each of the plurality of battery packs, wherein the isolation monitor is integrated within the electric work vehicle and connected to a chassis ground of the electric work vehicle, the method comprising:

detecting with the isolation monitor an existence of a ground fault;

notifying a user of the electric work vehicle of the existence of the ground fault;

opening the plurality of contactors;

sequencing closure of the plurality of contactors to include each of the plurality of battery packs in the circuit with the isolation monitor, and using the isolation monitor to determine that at least one battery pack of the plurality of battery packs that is included in the circuit with the isolation monitor comprises a faulty battery pack, wherein the faulty battery pack comprises a ground fault; and disconnecting the faulty battery pack or battery packs.

2. The method of claim 1, wherein the method further comprises, prior to sequencing closure, determining that the ground fault is in at least one battery pack of the plurality of battery packs.

3. The method of claim 2, wherein determining that the ground fault is in at least one battery pack of the plurality of battery packs comprises closing the plurality of contactors to include all of the plurality of battery packs in the circuit with the isolation monitor.

4. The method of claim 2, wherein determining that the ground fault is in at least one battery pack of the plurality of battery packs comprises opening the plurality of contactors to include none of the plurality of battery packs in the circuit with the isolation monitor.

5. The method of claim 2, further comprising notifying the user of which battery pack of the plurality of battery packs is the faulty battery pack or battery packs.

6. The method of claim 2, wherein the battery packs of the plurality of battery packs are connected in parallel.

7. The method of claim 2, wherein the electric work vehicle further comprises a battery management system and a controller area network, and wherein the isolation monitor communicates with the battery management system over the controller area network.

8. The method of claim 2, wherein the electric work vehicle comprises a machine power electronics apparatus that comprise the isolation monitor.

9. The method of claim 2, wherein sequencing closure of the plurality of contactors comprises including only one of the plurality of battery packs in the circuit with the isolation monitor at a time.

10. The method of claim 2, wherein prior to sequencing closure of the plurality of contactors, the method further comprises sequencing closure of the plurality of contactors to include more than one of the plurality of battery packs in the circuit with the isolation monitor at a time, and using the isolation monitor to determine whether the battery packs that are included in the circuit with the isolation monitor comprise a faulty battery pack.

11. The method of claim 2, wherein the method further comprises, after disconnecting the faulty battery pack, determining with the isolation monitor that an additional ground fault exists in the electric work vehicle.

12. A ground fault test apparatus for an electric work vehicle, wherein the electric work vehicle comprises:

an aggregated battery comprising a plurality of battery packs;

a battery management system;

an isolation monitor; and a circuit configured to connect the aggregated battery to the isolation monitor, wherein the circuit comprises a plurality of contactors configured to facilitate connection to the circuit and disconnection from the circuit of each of the plurality of battery packs;

wherein in response to the isolation monitor detecting an existence of a ground fault, the ground fault test apparatus is configured to:

notify a user of the electric work vehicle of the detection of existence of a ground fault;

use the battery management system to:

open the plurality of contactors of all of the battery packs;

close the plurality of contactors of a first subset of the plurality of battery packs to determine that the first subset excludes a faulty battery pack; and sequence closure of the plurality of contactors to include each of the plurality of battery packs of a second subset of the plurality of battery packs in the circuit with the isolation monitor in turn, and use the isolation monitor to determine that at least one battery pack of the second subset of the plurality of battery packs that is included in the circuit with the isolation monitor comprises the faulty battery pack, wherein the faulty battery pack comprises a ground fault; and disconnect the faulty battery pack.

13. The ground fault test apparatus of claim 12, wherein the electric work vehicle further comprises a battery management system and a controller area network, and wherein the isolation monitor communicates with the battery management system over the controller area network.

14. The ground fault test apparatus of claim 12, wherein the ground fault test apparatus is further configured to output an identification of the faulty battery pack.

15. The ground fault test apparatus of claim 12, wherein the ground fault test apparatus is further configured to determine whether there is an additional ground fault after disconnecting the faulty battery pack.

16. A method of performing a ground fault test on an aggregated battery of an electric work vehicle, the aggregated battery including a plurality of battery packs, the electric work vehicle including an isolation monitor and a circuit configured to connect the aggregated battery to the isolation monitor, the circuit including a plurality of contactors configured to facilitate connection to the circuit and disconnection from the circuit of each of the plurality of battery packs, the method comprising:

detecting an existence of a ground fault with the isolation monitor;

closing the plurality of contactors to a first set of battery packs of the plurality of battery packs in the circuit with the isolation monitor;

determining with the isolation monitor that the first set of battery packs does not include a faulty battery pack;

closing the plurality of contactors to a second set of battery packs of the plurality of battery packs in the circuit with the isolation monitor;

determining with the isolation monitor that at least one battery pack of the second set of battery packs includes a faulty battery pack experiencing a ground fault;

sequentially opening and closing the plurality of contactors to each of the battery packs of the second set of battery packs, to determine that at least one battery pack of the second set of battery packs is a faulty battery pack; and disconnecting the faulty battery pack.

17. The method of claim 16, further comprising outputting a notification identifying the faulty battery pack.

18. The method of claim 16, wherein either i) each of the first set of battery packs and the second set of battery packs includes a same number of battery packs, or ii) one of the first and second sets of battery packs includes one additional battery pack than the other of the first and second sets of battery packs.

19. The method of claim 16, wherein disconnecting the faulty battery pack includes opening the contactors to disconnect the faulty battery pack from the circuit.

20. The method of claim 16, further comprising:

after disconnecting the faulty battery pack, permitting operation of the electric work vehicle with power stored in the battery packs other than the faulty battery pack.

* * * * *